(12) United States Patent
Maeno

(10) Patent No.: US 10,453,840 B2
(45) Date of Patent: Oct. 22, 2019

(54) SEMICONDUCTOR INTEGRATED CIRCUIT

(71) Applicant: KABUSHIKI KAISHA TOSHIBA, Tokyo (JP)

(72) Inventor: Muneaki Maeno, Yokohama Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/247,588

(22) Filed: Aug. 25, 2016

(65) Prior Publication Data

US 2017/0229457 A1 Aug. 10, 2017

(30) Foreign Application Priority Data

Feb. 4, 2016 (JP) ................... 2016-020237

(51) Int. Cl.
  *H01L 27/092* (2006.01)
  *H01L 27/07* (2006.01)
  *H01L 27/02* (2006.01)

(52) U.S. Cl.
  CPC ........ *H01L 27/092* (2013.01); *H01L 27/0207* (2013.01); *H01L 27/0738* (2013.01)

(58) Field of Classification Search
  CPC .................................................. H01L 27/092
  See application file for complete search history.

(56) References Cited

U.S. PATENT DOCUMENTS

| 5,751,651 | A | 5/1998 | Ooishi |
| 5,946,177 | A * | 8/1999 | Miller ................. H01L 27/0248 361/56 |
| 6,396,306 | B2 | 5/2002 | Dring et al. |
| 6,429,469 | B1 | 8/2002 | Allen et al. |

(Continued)

FOREIGN PATENT DOCUMENTS

| JP | H08138381 A | 5/1996 |
| JP | H10223773 A | 8/1998 |

(Continued)

OTHER PUBLICATIONS

Japanese Office Action dated May 22, 2018, filed in counterpart Japanese Patent Application No. 2016-020237 (7 pages) (with translation).

*Primary Examiner* — Hoang-Quan T Ho
(74) *Attorney, Agent, or Firm* — Kim & Stewart LLP

(57) ABSTRACT

A semiconductor integrated circuit comprises first and second transistors, and a resistive element. The first transistor includes first and second regions of first conductivity type in a first well region of opposite conductivity type, and a first gate electrode on the first well region between the first and second regions. The second transistor includes third and fourth region of second conductivity type in a second well region of opposite conductivity type, and a second gate electrode on the second well region between the third and fourth regions. The first region is connected to a first line, and the third and fourth regions are connected to a second line. The resistance element includes a first end connected to (Continued)

the first and second gate electrodes, a second end connected to the second line, and a resistive electrical path between the first and second ends including a portion of the third region.

20 Claims, 18 Drawing Sheets

(56) References Cited

U.S. PATENT DOCUMENTS

| | | | |
|---|---|---|---|
| 6,608,744 B1 * | 8/2003 | Kato | H01L 27/0266 361/111 |
| 6,814,296 B2 | 11/2004 | Angle et al. | |
| 6,941,535 B2 | 9/2005 | Sekido | |
| 7,107,467 B2 | 9/2006 | Lee et al. | |
| 7,137,094 B2 | 11/2006 | Tien | |
| 7,161,792 B2 | 1/2007 | Sakurabayashi et al. | |
| 7,221,183 B2 | 5/2007 | Chen | |
| 7,358,555 B2 | 4/2008 | Iwamatsu et al. | |
| 7,456,446 B2 | 11/2008 | Tahira et al. | |
| 7,501,884 B2 | 3/2009 | Chen | |
| 7,508,696 B2 | 3/2009 | Komaki | |
| 7,663,851 B2 * | 2/2010 | Huang | H01L 27/0251 361/111 |
| 7,698,670 B2 | 4/2010 | Masumura | |
| 7,710,695 B2 * | 5/2010 | Chen | H01L 27/0285 361/56 |
| 7,800,151 B2 | 9/2010 | Mizushino et al. | |
| 7,949,988 B2 | 5/2011 | Tsai et al. | |
| 8,134,824 B2 | 3/2012 | Frederick et al. | |
| 8,461,920 B2 | 6/2013 | Nakanishi | |
| 8,482,323 B2 | 7/2013 | Eimitsu et al. | |
| 8,975,677 B2 | 3/2015 | Kito | |
| 9,472,546 B2 | 10/2016 | Kito | |
| 2003/0043517 A1 * | 3/2003 | Tsuji | H01L 27/0285 361/56 |
| 2005/0275449 A1 | 12/2005 | Chen | |
| 2006/0268474 A1 * | 11/2006 | Huang | H01L 27/0251 361/56 |
| 2008/0067599 A1 * | 3/2008 | Tsutsumi | H01L 21/82381 257/358 |
| 2008/0106834 A1 * | 5/2008 | Hung | H02H 9/046 361/56 |
| 2008/0158748 A1 * | 7/2008 | Kemper | H01L 27/0266 361/56 |
| 2008/0297960 A1 * | 12/2008 | Chen | H01L 27/0285 361/56 |
| 2009/0207552 A1 | 8/2009 | Frederick, Jr. et al. | |
| 2012/0081820 A1 * | 4/2012 | Chu | H02H 9/046 361/56 |
| 2013/0286520 A1 * | 10/2013 | Shan | H01L 23/60 361/57 |
| 2016/0379970 A1 | 12/2016 | Kito | |

FOREIGN PATENT DOCUMENTS

| | | |
|---|---|---|
| JP | 2002083873 A | 3/2002 |
| JP | 2003086699 A | 3/2003 |
| JP | 2003243519 A | 8/2003 |
| JP | 2003256489 A | 9/2003 |
| JP | 2004342924 A | 12/2004 |
| JP | 2005167039 A | 6/2005 |
| JP | 2005276970 A | 10/2005 |
| JP | 2006303377 A | 11/2006 |
| JP | 2007234857 A | 9/2007 |
| JP | 2007273846 A | 10/2007 |
| JP | 2008070924 A | 3/2008 |
| JP | 2011233945 A | 11/2011 |
| JP | 2012222065 A | 11/2012 |
| JP | 2013-219266 A | 10/2013 |

* cited by examiner

SEMICONDUCTOR INTEGRATED CIRCUIT

CROSS-REFERENCE TO RELATED APPLICATION

This application is based upon and claims the benefit of priority from Japanese Patent Application No. 2016-020237, filed Feb. 4, 2016, the entire contents of which are incorporated herein by reference.

FIELD

Embodiments described herein relate generally to a semiconductor integrated circuit.

BACKGROUND

Semiconductor integrated circuits including Tie-High cells, Tie-Low cells, or decoupling cells are known.

DETAILED DESCRIPTION

Figure 1:
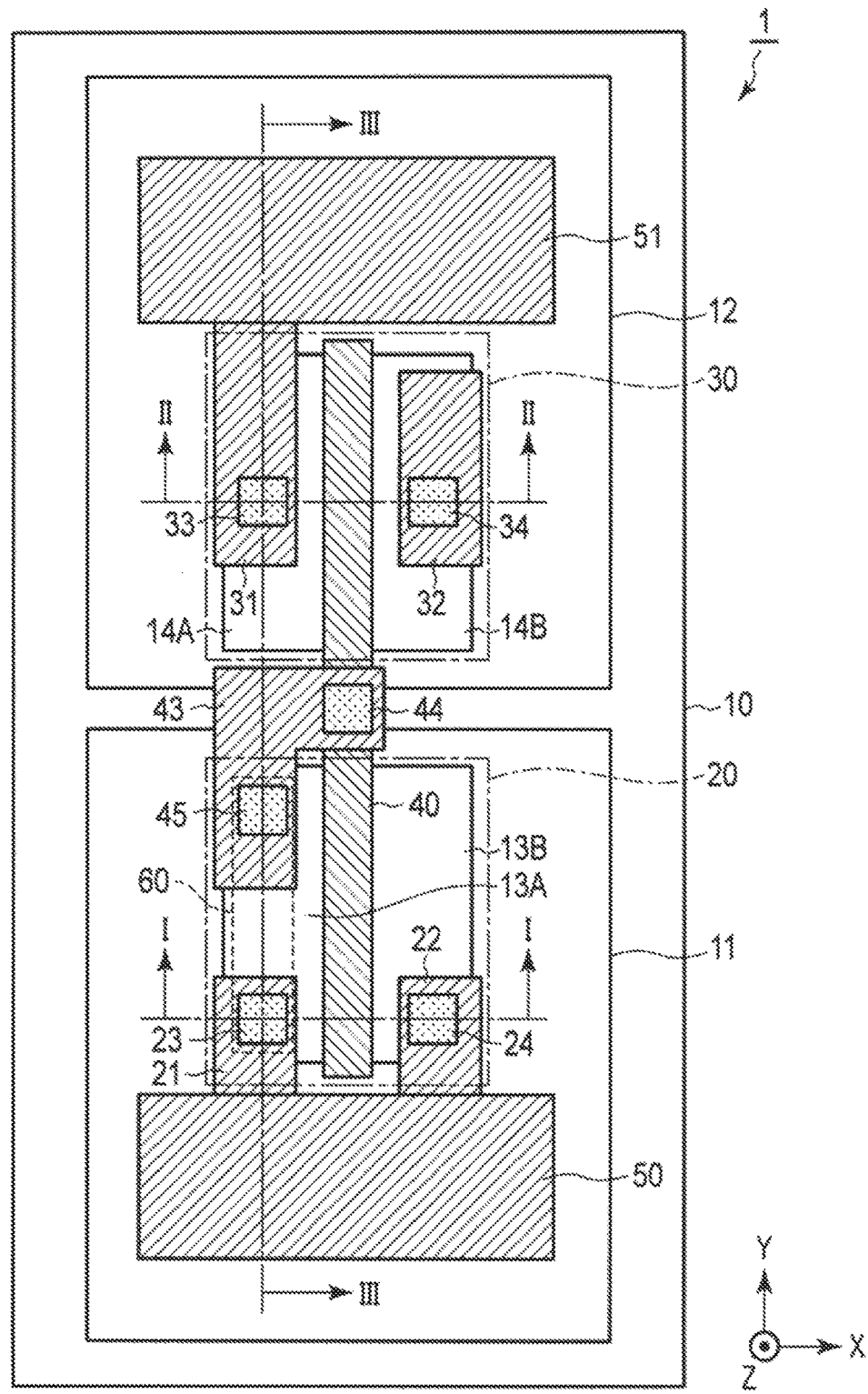
FIG. 1 is a diagram illustrating a layout of a semiconductor integrated circuit according to a first embodiment.

In general, according to one embodiment, a semiconductor integrated circuit includes a first transistor, a second transistor, and a resistance element. The first transistor comprises a first impurity region of a first conductivity type in a first well region of a conductivity type opposite the first conductivity type, a second impurity region of the first conductivity type in the first well, and a first gate electrode on the first well region between the first and second impurity regions, the first impurity region being electrically connected to a first power line. The second transistor comprises a third impurity region of a second conductivity type in a second well region of a conductivity type opposite the second conductivity type, a fourth impurity region of the second conductivity type in the second well, and a second gate electrode on the second well region between the third and fourth impurity regions. The second gate electrode is electrically connected to the first gate electrode, and the third and fourth impurity regions are electrically connected to a second power line. The resistance element includes a first end electrically connected to the first and second gate electrodes, a second end electrically connected to the second power line, and a resistive electrical path between the first and second ends including a portion of the third impurity region.

Hereinafter, embodiments will be described with reference to the drawings. In the following description, common reference numerals are given to elements having substantially the same functions and configurations. In the specification and drawings, when letters are appended after a numeral, the use of letters is used distinguish multiple instances of an element type. Similarly, when a reference numeral is followed by a hyphen and another numeral, the numeral after the hyphen can be considered an indexing value to distinguish multiple instances of an element type.

The drawings are schematic and not necessarily to scale. In the present disclosure, apparatuses incorporating the exemplified technical aspects of the example embodiments may differ in shapes, structures, arrangements, and the like of constituent elements according to variations apparent to those of ordinary skill in the art.

[1] First Embodiment

Hereinafter, a semiconductor integrated circuit according to a first embodiment will be described.

[1-1] Configuration of Semiconductor Integrated Circuit 1

Figure 2:
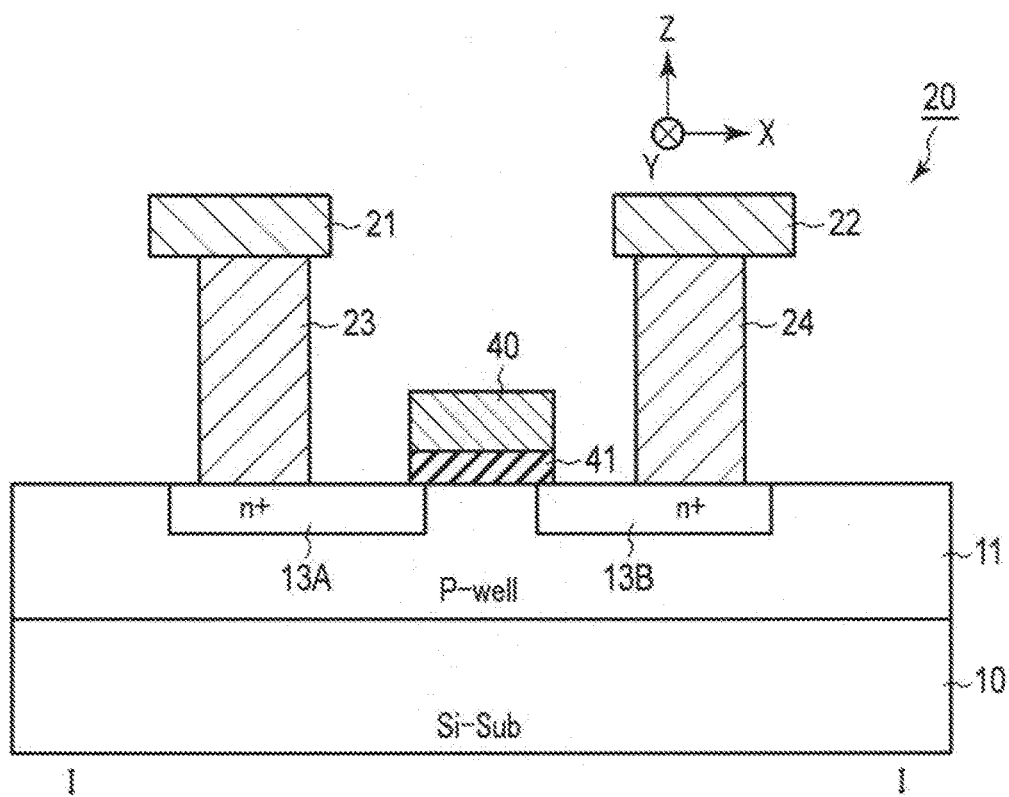
FIG. 2 is a cross-sectional view taken along the line I-I in FIG. 1.
Figure 3:
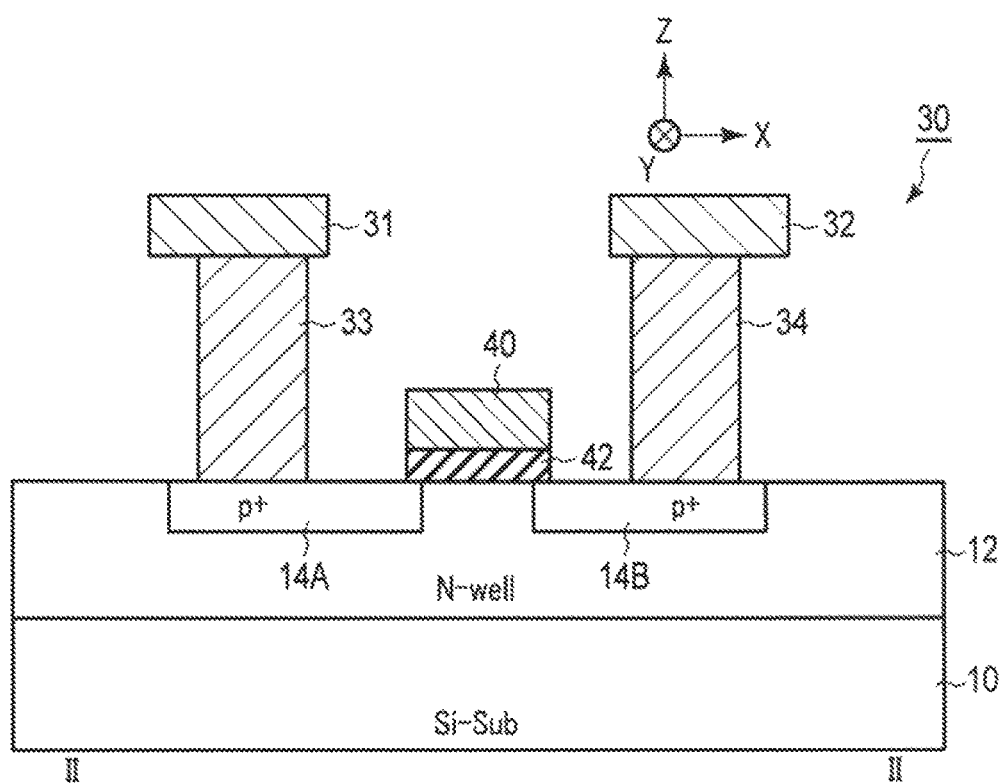
FIG. 3 is a cross-sectional view taken along the line II-II in FIG. 1.
Figure 4:
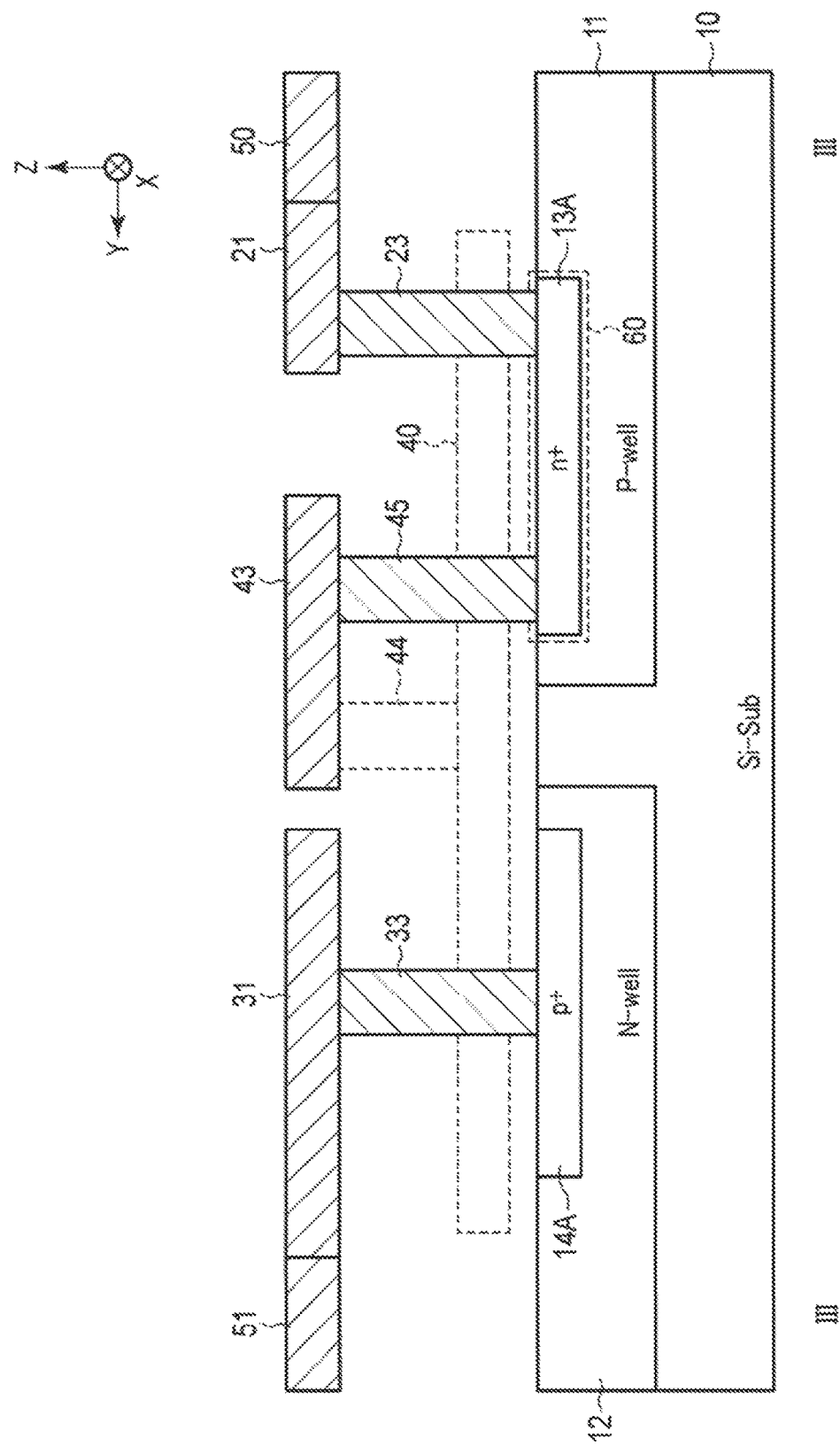
FIG. 4 is a cross-sectional view taken along the line III-III in FIG. 1.
Figure 5:
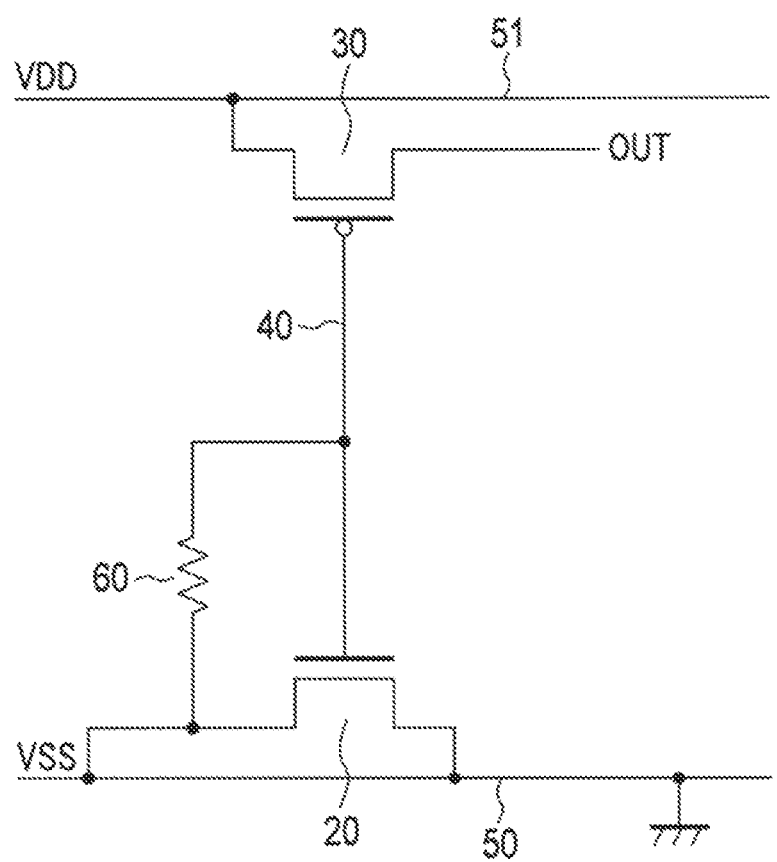
FIG. 5 is an equivalent circuit diagram illustrating the semiconductor integrated circuit according to the first embodiment.

First, configuration of a semiconductor integrated circuit according to this first embodiment will be described with reference to FIGS. 1 to 5. FIG. 1 illustrates a planar layout of the semiconductor integrated circuit 1. FIGS. 2 to 4 illustrate the cross-sectional structure of the semiconductor integrated circuit 1. FIG. 5 illustrates an equivalent circuit configuration of the semiconductor integrated circuit 1.

As illustrated in FIGS. 1 and 5, a semiconductor integrated circuit 1 according to this first embodiment includes an NMOS transistor 20, a PMOS transistor 30, and a resistance element 60 that are formed on a semiconductor substrate 10.

In the semiconductor substrate 10, a P-type well region 11 and an N-type well region 12 are arranged along a Y direction. In the P-type well region 11, $n^+$ impurity diffusion areas 13A and 13B are spaced from each other in an X direction and extend along the Y direction (perpendicular to the X direction) (see FIG. 2). In the N-type well region 12, $p^+$ impurity diffusion areas 14A and 14B are spaced from each other in the X direction (see FIG. 3) and extend along the Y direction. The impurity regions may also be referred to as "doped regions" in some instances. A wiring layer 40 extending in the Y direction is arranged on a region between the diffusion areas 13A and 13B and a region between the diffusion areas 14A and 14B with gate insulation films 41 and 42 (respectively) interposed therebetween. The wiring layer 40 functions as a gate electrode of the transistors 20 and 30. Accordingly, the NMOS transistor 20 and the PMOS transistor 30 in which the wiring layer 40 functions as a common gate electrode are formed in the P-type well region 11 and the N-type well region 12, respectively.

The diffusion areas 13A and 13B function as a source and a drain of the NMOS transistor 20, respectively. The diffusion areas 14A and 14B function as a source and a drain of the PMOS transistor 30, respectively. Furthermore, via contacts 23, 24, 33, and 34 are formed on portions of diffusion areas 13A, 13B, 14A, and 14B, respectively, and wiring layers 21, 22, 31, and 32 are formed on the via contacts 23, 24, 33, and 34, respectively. The wiring layers 21 and 22 function a source wiring and a drain wiring of the transistor 20, respectively, and the wiring layers 31 and 32 function as a source wiring and a drain wiring of the transistor 30, respectively.

A via contact 45 is also formed on the diffusion area 13A, and a wiring layer 43 is formed on the via contact 45 (see FIG. 4). The wiring layer 21 is connected to a low-voltage power line (for example, a ground line) 50 and the wiring layer 31 is connected to a high-voltage power line 51. As indicated by a dotted line in FIG. 4, the wiring layer 40 is provided passing over a region between the well regions 11 and 12, and a via contact 44 is formed on the wiring layer 40 in the region between the well regions 11 and 12. A wiring layer 43 is formed on the via contact 44 and the wiring 43 is also connected to the via contact 45. The via contacts 23 and 45 are arranged offset in the Y direction and are separated from each on the diffusion area 13A. The wiring layers 21 and 43 are also separated, and but both are electrically connected by a pathway through the via contact 23, the diffusion area 13A, and the via contact 45. Here, the wiring layers 21 and 43 are not otherwise connected along any path not passing through the diffusion area 13A. The diffusion area 13A between the via contacts 23 and 45 therefore functions as a diffusion resistor (resistance element 60).

The semiconductor integrated circuit 1 having the above-described configuration is illustrated as an equivalent electrical circuit in FIG. 5. Here, the source and the drain of the transistor 20 are connected to the low-voltage power line 50, and the gate of the transistor 20 is connected to the gate of the transistor 30. The source of the transistor 30 is connected to the high-voltage power line 51 and a signal OUT is output from the drain of the transistor 30. One end of the resistance element 60 is connected to the common gate 40 of the transistors 20 and 30 and the other end of the resistance element 60 is connected to the source of the transistor 20. That is, gates of the transistor 20 and transistor 30 can be said to be connected to each other (commonly connected) and may be referred to collectively as a common gate 40. For example, a ground voltage VSS is applied to the low-voltage power line 50, and a power voltage VDD is applied to the high-voltage power line 51.

For convenience of the description, the sources and the drains of the transistors 20 and 30 can be considered as described above, but in other embodiments the connection of sources and the drains may be altered or varied, such as the connections may be reversed, for example.

[1-2] Advantages of First Embodiment

Next, advantages of this first embodiment will be described. In the semiconductor integrated circuit 1 according to this first embodiment, it is possible to improve ESD resistance of the semiconductor integrated circuit 1.

In a logic circuit, which is an electric circuit, and/or an electronic circuit performing a logic operation, an input terminal of the circuit is connected to a power supply through a resistance element for an ESD countermeasure when the potential of the input terminal is to be nominally fixed to a high level or a low level. There are known a Tie-High cell and a Tie-Low cell which are formed using a PMOS transistor and an NMOS transistor having a common gate in a floating state. In these Tie-High and Tie-Low cells, the common gate (in a floating state) is charged or discharged using a leakage current flowing through a transistor, and a transistor, having a drain connected to an input terminal of the logic circuit, is turned on. Accordingly, the Tie-High cell and the Tie-Low cell can output signals of a high level and a low level, respectively.

In order to realize low power consumption, however, it is desirable to reduce the leakage current of the transistor in the cell. From this viewpoint, transistors having a high threshold voltage are used in the Tie-High cell and the Tie-Low cell in many cases. However, in such a case, since the leakage current supplied to a floating unit of the Tie-High cell and the Tie-Low cell decreases, it is difficult to turn on (or otherwise control conductance) of the transistor used as the resistance element. In a typical semiconductor integrated circuit there is a plurality of regions including logic circuits and the device will be controlled according to operational requirements to turn on/off power for each region of these various regions of the semiconductor integrated circuit to realize lower power consumption. When power is frequently turned on or off for these various regions, the power may have to be turned off before the potential of a floating unit is sufficiently fixed in some cases. In such a case, it will be difficult or impossible to obtain sufficient resistance in the Tie-High cell and the Tie-Low cell because the appropriate potential of the floating common gate has not been obtained appropriately.

However, in the semiconductor integrated circuit 1 according to this first embodiment, the common gate (also referred to as wiring layer 40) of the above-described Tie-High cell is connected to the diffusion area 13A to which the source wiring (the wiring layer 21) of the NMOS transistor 20 is connected. That is, the common gate is electrically connected to the low-voltage power line 50 through the diffusion area 13A and the source wiring of the transistor 20. At this time, the diffusion area 13A substantially functions as the resistance element 60 and conductance state of transistor 20 is not of particular concern.

In the above-described configuration, a common gate of the Tie-High cell is connected to the low-voltage power line 50 through the resistance element 60, and therefore a charge or discharge time necessary to fix the potential of the common gate is shortened. The potential of the common gate 40 is connected to the low-voltage power line 50 through the resistance element 60, and therefore the potential of the common gate 40 is stabilized to the potential of the low-voltage power line without depending particularly on the threshold voltage of the transistors (20 and 30) included in the semiconductor integrated circuit 1.

Accordingly, in the semiconductor integrated circuit 1 according to this first embodiment, the ESD resistance can be improved for the Tie-High cell in which the potential of the input terminal of the logic circuit is to be fixed to a high level. The Tie-High cell can be configured in this manner without using an external resistance element by using the diffusion area 13A to provide the appropriate electrical resistance. Therefore, it is possible to provide the Tie-High cell depicted in FIG. 5 without substantial increase in total circuit area, which might be required if resistance element 60 were a separately provided discrete resistance component not formed using an existing, standard portion of the logic circuit.

The method of connecting the common gate to the low-voltage power line 50 is not limited thereto, but can be modified in various forms. For example, the common gate may be connected to the diffusion area 13B to which the drain wiring (the wiring layer 22) of the transistor 20 is connected. In this case, the common gate is electrically connected to the low-voltage power line 50 through the diffusion area 13B and the drain wiring of the transistor 20, and the diffusion area 13B substantially functions as the resistance element 60. The common gate may also be connected to the low-voltage power line 50 using both of the diffusion areas 13A and 13B as the resistance elements 60.

[2] Second Embodiment

Next, a semiconductor integrated circuit according to a second embodiment will be described. In this second embodiment, the configuration described for the first embodiment is applied to a Tie-Low cell. Hereinafter, differences from the first embodiment will be described.

[2-1] Configuration of Semiconductor Integrated Circuit 1

Figure 6:
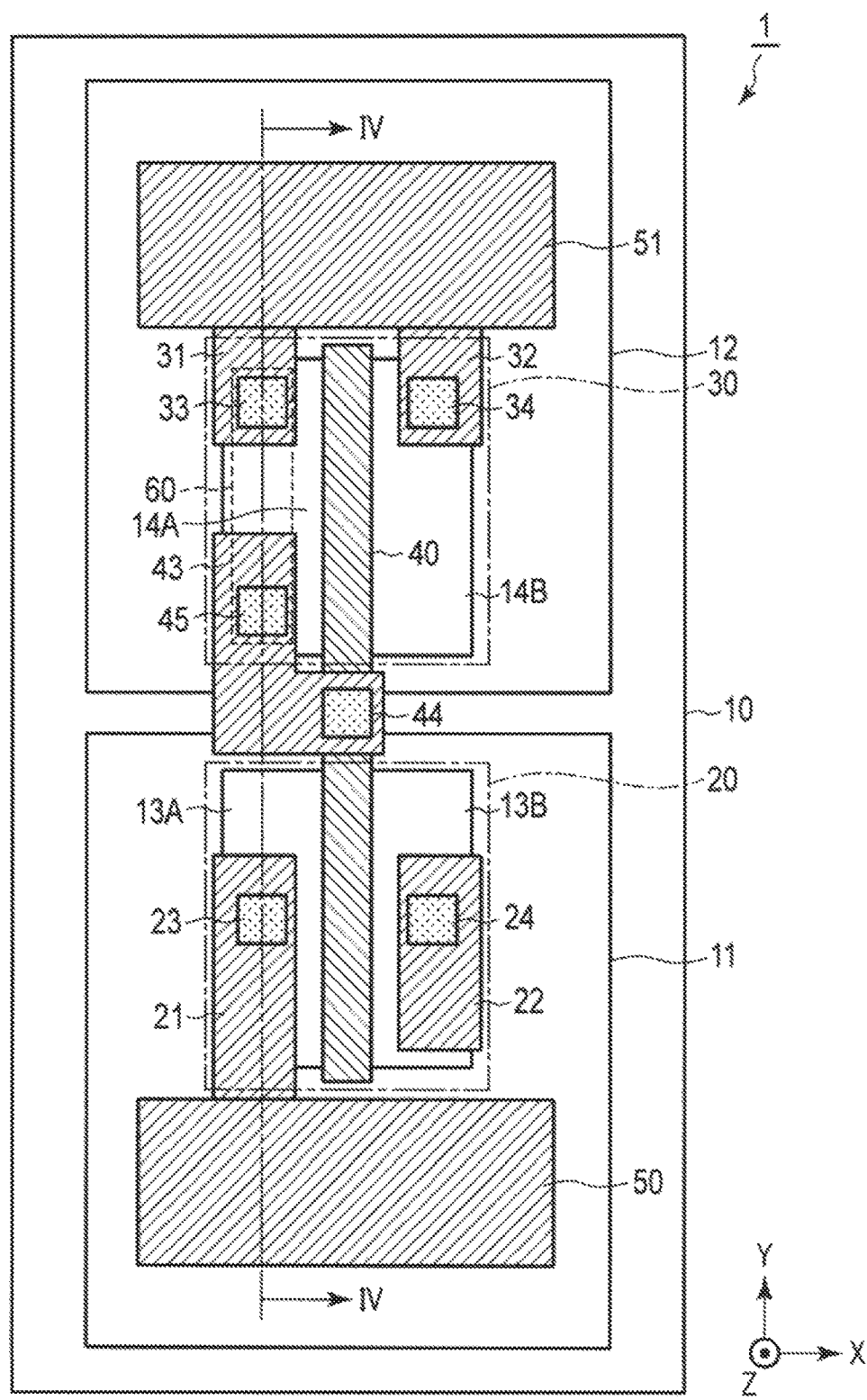
FIG. 6 is a diagram illustrating a layout of a semiconductor integrated circuit according to a second embodiment.
Figure 7:
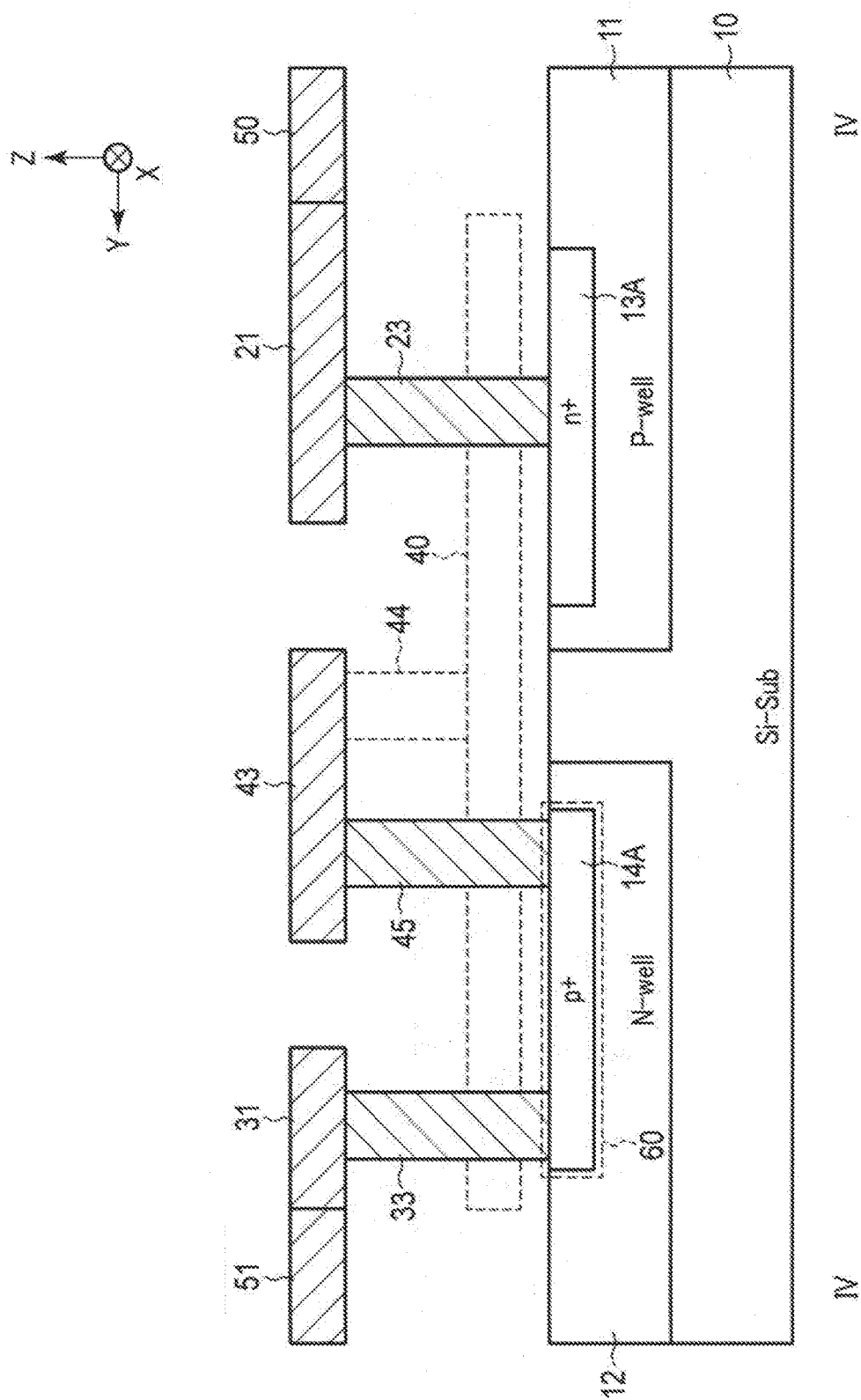
FIG. 7 is a cross-sectional view taken along the line IV-IV in FIG. 6.
Figure 8:
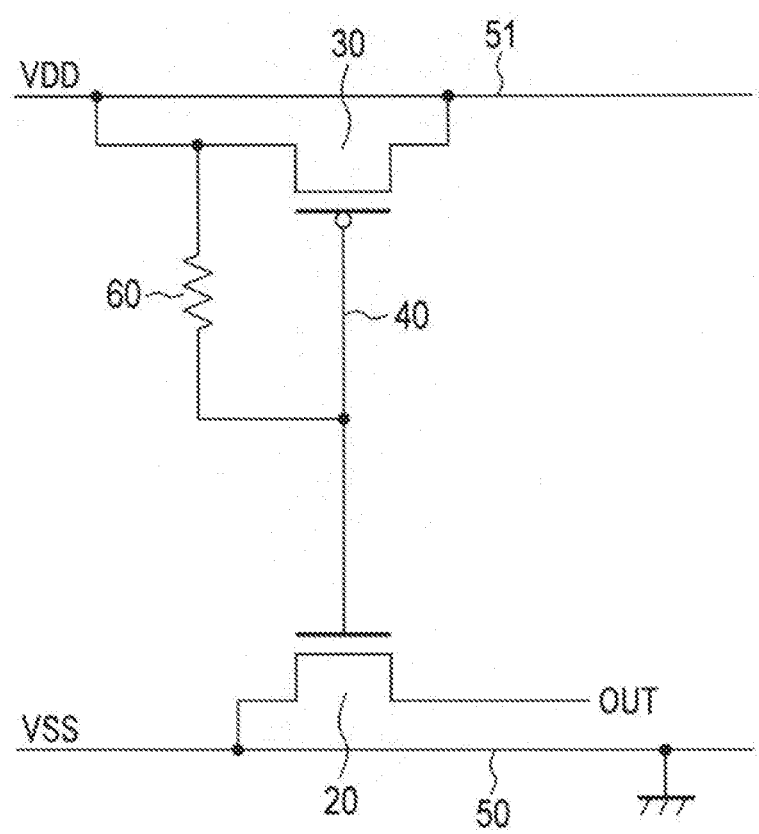
FIG. 8 is an equivalent circuit diagram illustrating the semiconductor integrated circuit according to the second embodiment.

First, the configuration of the semiconductor integrated circuit 1 according to this second embodiment will be described with reference to FIGS. 6 to 8. FIG. 6 illustrates a planar layout of the semiconductor integrated circuit 1. FIG. 7 illustrates a cross-sectional structure of the semiconductor integrated circuit 1. FIG. 8 illustrates the configuration of an equivalent circuit of the semiconductor integrated circuit 1. The semiconductor integrated circuit 1 according to this second embodiment is different from the first embodiment in a connection relation of each wiring.

The via contact 45 is formed on the diffusion area 13A (see FIGS. 1 and 4) described in the first embodiment, but in the second embodiment the via contact 45 is formed on the diffusion area 14A in the semiconductor integrated circuit 1, as illustrated in FIGS. 6 and 7.

The via contacts 33 and 45 are arranged in the Y direction and are separated from each other on the diffusion area 14A. The wiring layers 31 and 43 are also separated from each other, and both of the wiring layers are electrically connected along a path passing through the via contact 33, the diffusion area 14A, and the via contact 45. Here, the wiring layers 31 and 43 are not connected along any path not passing through the diffusion area 14A. In this second embodiment, that is, the diffusion area 14A between the via contacts 33 and 45 functions as a diffusion resistor (resistance element 60).

The semiconductor integrated circuit 1 of the second embodiment is illustrated as an equivalent circuit in FIG. 8. That is, the semiconductor integrated circuit 1 according to this second embodiment is configured such that the other end of the diffusion resistor 60 is connected to the source of the transistor 30, the signal OUT is output from the drain of the transistor 20, and the drain of the transistor 30 is connected to the high-voltage power line 51, while in the first embodiment (described with reference to FIG. 5) has the configuration that the other end of the diffusion resistor 60 is connected to the source of the transistor 20, the drain of the transistor 20 is connected to the low-voltage power line 50, and the signal OUT is output from the drain of the transistor 30.

[2-2] Advantages of Second Embodiment

In this second embodiment, it is possible to obtain the same advantages as those of the first embodiment but in a Tie-Low cell instead of Tie-High cell. That is, according to the semiconductor integrated circuit 1 according to this second embodiment, the common gate (the wiring layer 40) of the Tie-Low cell is connected to the $p^+$ impurity diffusion area 14A to which the source wiring (the wiring layer 31) of the PMOS transistor 30 is connected. That is, the common gate is electrically connected to the high-voltage power line 51 through the source wiring and the diffusion area 14A of the transistor 30. The diffusion area 14A substantially functions as the resistance element 60.

With the above-described configuration of the second embodiment, the common gate of the Tie-Low cell is connected to the high-voltage power line 51 through the resistance element 60, and thus a charge or discharge time necessary to fix the potential of the common gate 40 is shortened. The potential of the common gate 40 is connected to the high-voltage power line 51 through the resistance element 60, and is thus fixed to the potential of the high-voltage power line 51 without depending on the particular threshold voltage of the transistors included in the semiconductor integrated circuit 1.

Therefore, according to the semiconductor integrated circuit 1 of this second embodiment, the same advantages as those of the first embodiment can be obtained in the Tie-Low cell in which the potential of the input terminal of the logic circuit is fixed to a low level.

The method of connecting the common gate 40 to the high-voltage power line 51 is not limited to the specific manner depicted, but can be modified in various ways. For example, the common gate 40 may be connected to the diffusion area 14B to which the drain wiring (the wiring layer 32) of the transistor 30 is connected. In this case, the common gate 40 is electrically connected to the high-voltage power line 51 through the diffusion area 14B and the drain region of the transistor 30, and the diffusion area 14B substantially functions as the resistance element 60. The common gate 40 may be connected to the high-voltage power line 51 using both of the diffusion areas 14A and 14B as the resistance elements 60.

[3] Third Embodiment

Next, a semiconductor integrated circuit 1 according to a third embodiment will be described. In this third embodiment, the configuration described in the above-described first and second embodiments is applied to a decoupling cell. Hereinafter, differences from the first and second embodiments will be described.

[3-1] Configuration of Semiconductor Integrated Circuit 1

Figure 9:
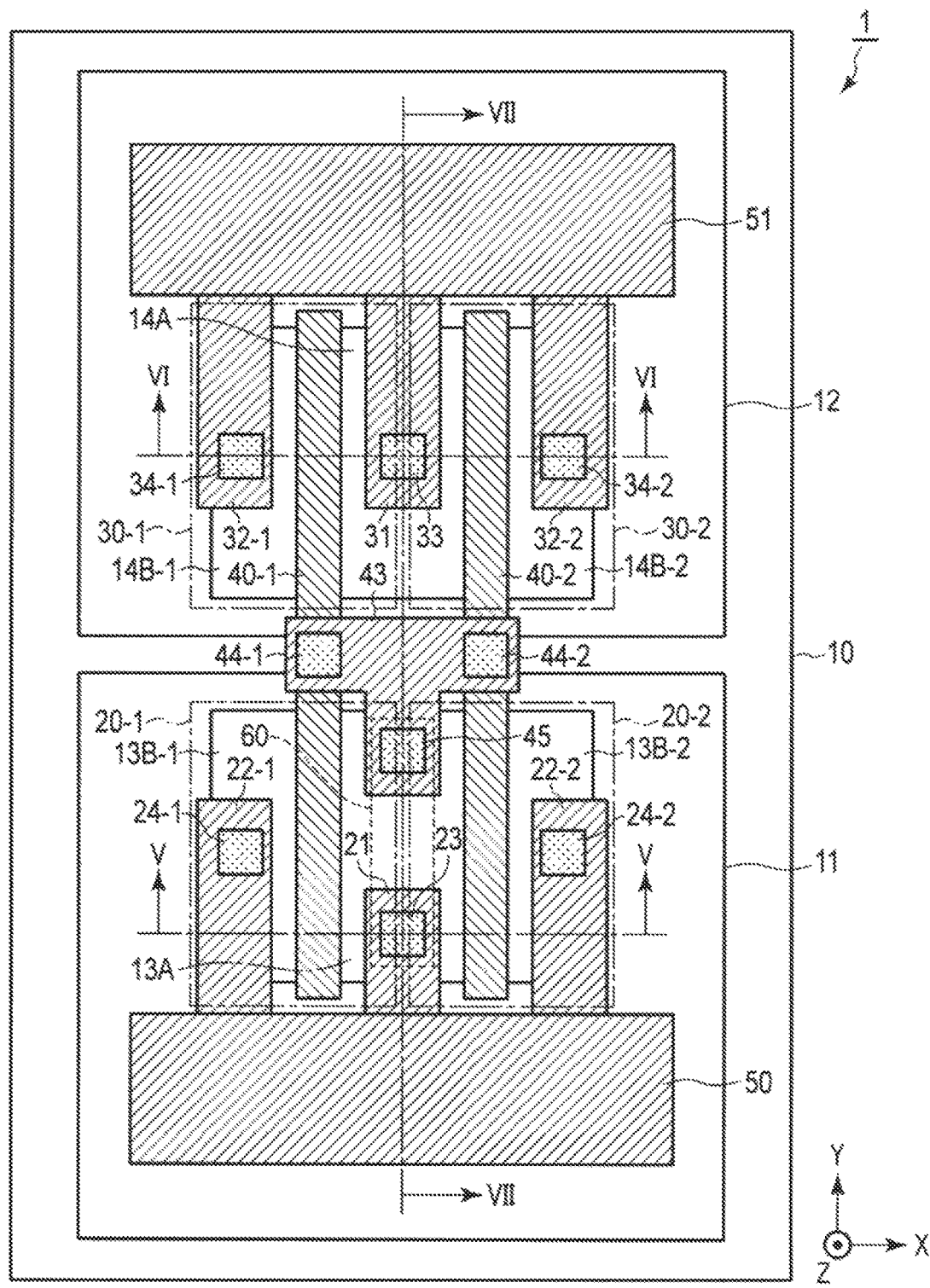
FIG. 9 is a diagram illustrating a layout of a semiconductor integrated circuit according to a third embodiment.
Figure 10:
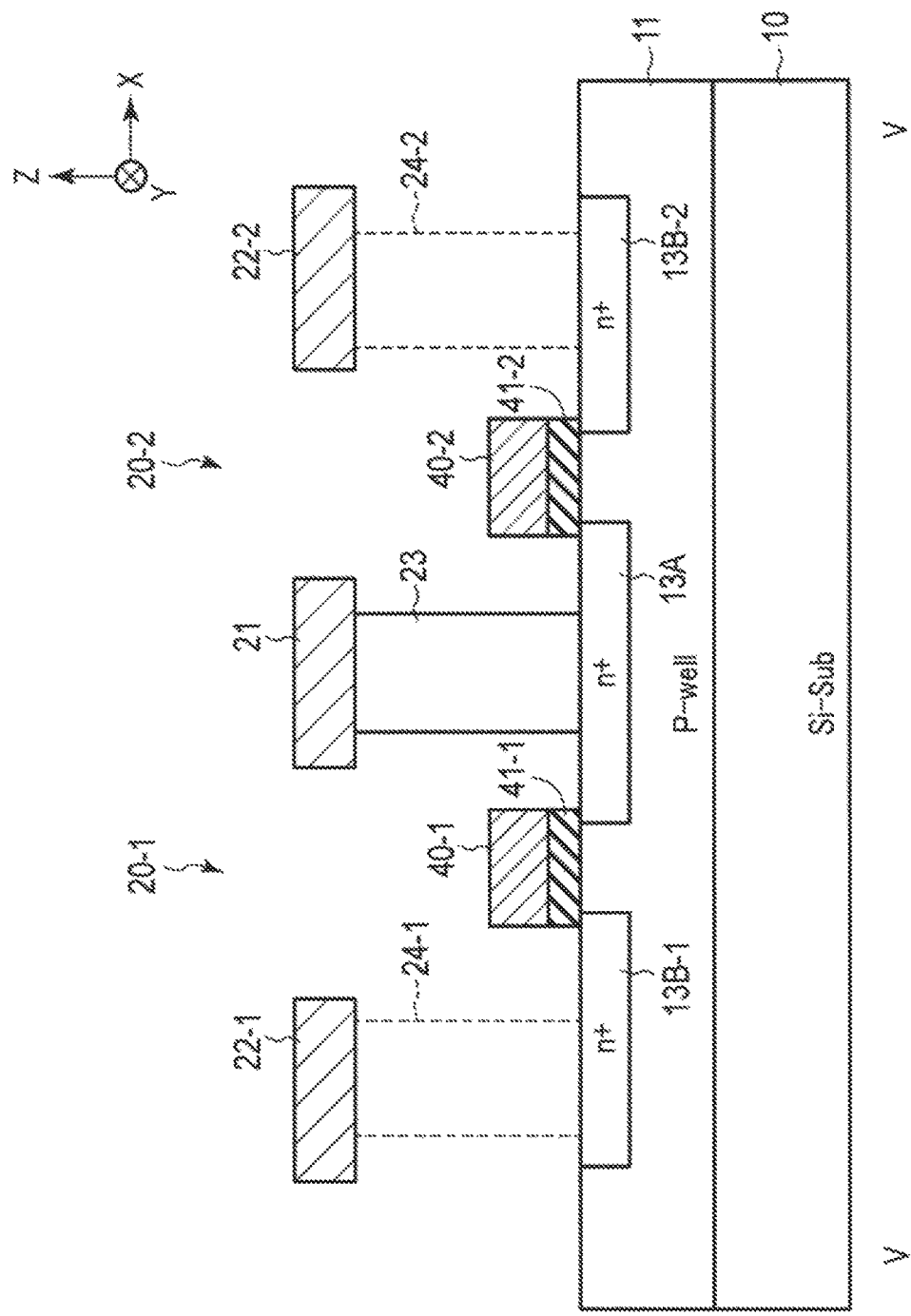
FIG. 10 is a cross-sectional view taken along the line V-V in FIG. 9.
Figure 11:
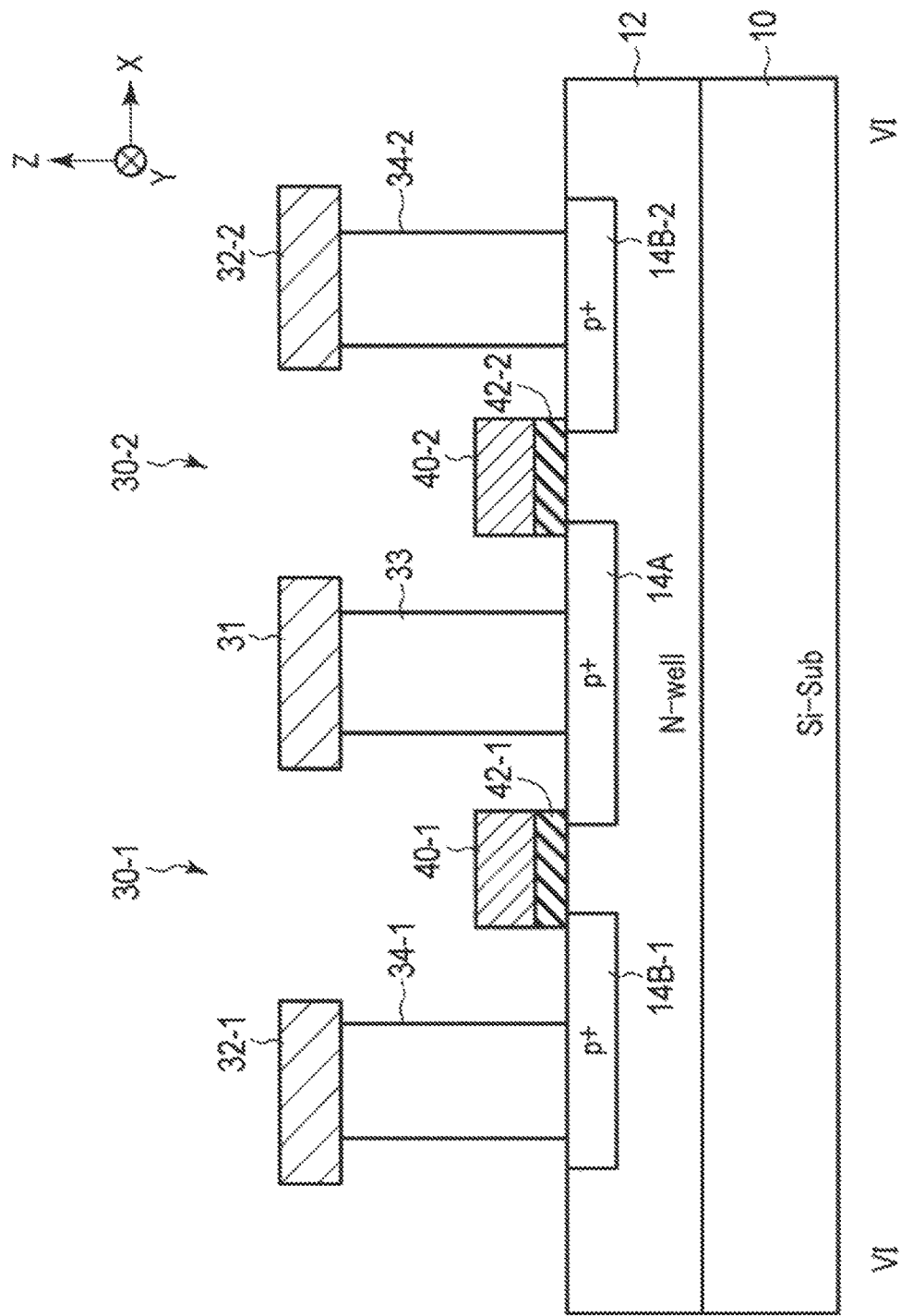
FIG. 11 is a cross-sectional view taken along the line VI-VI in FIG. 9.
Figure 12:
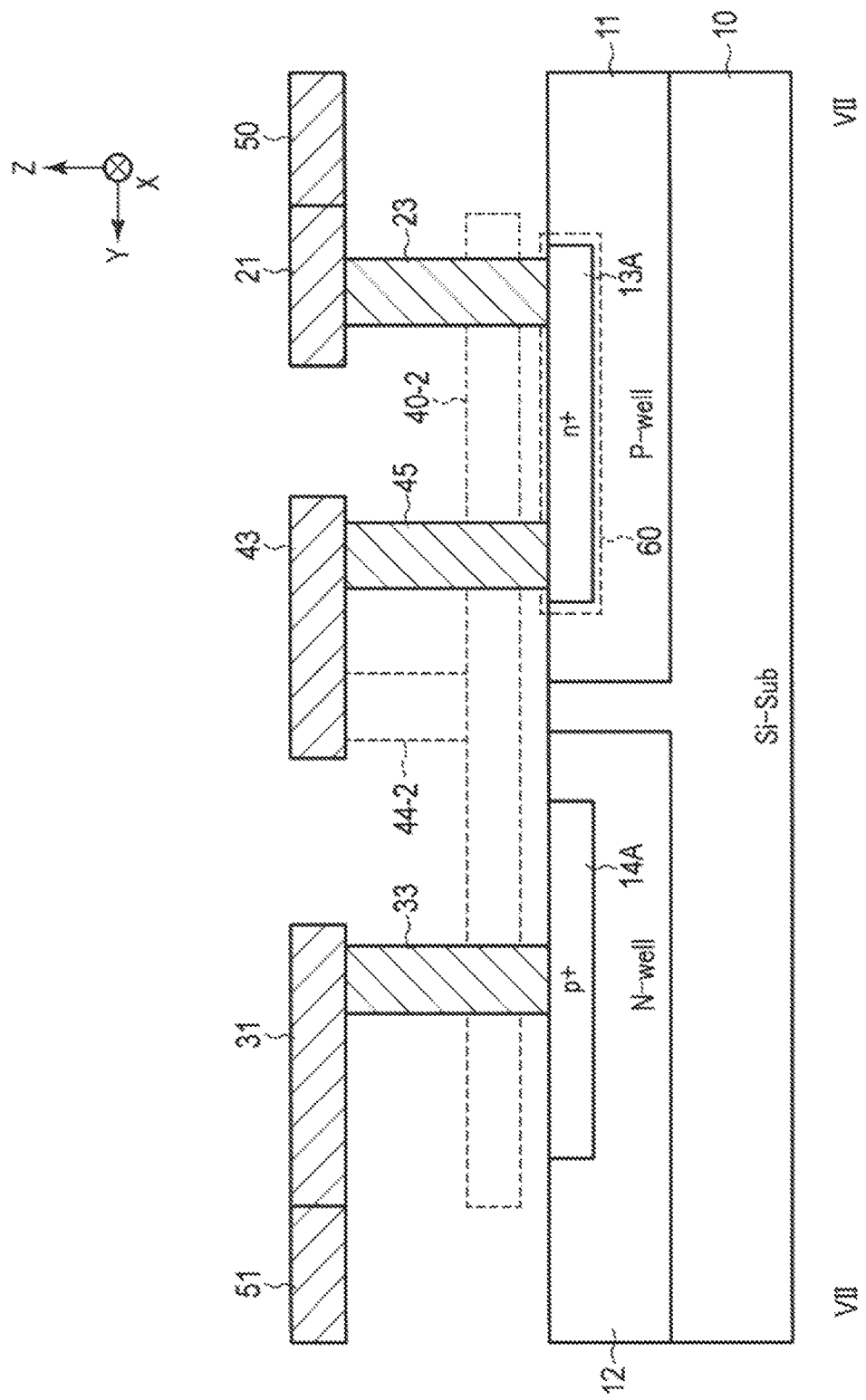
FIG. 12 is a cross-sectional view taken along the line VII-VII in FIG. 9.
Figure 13:
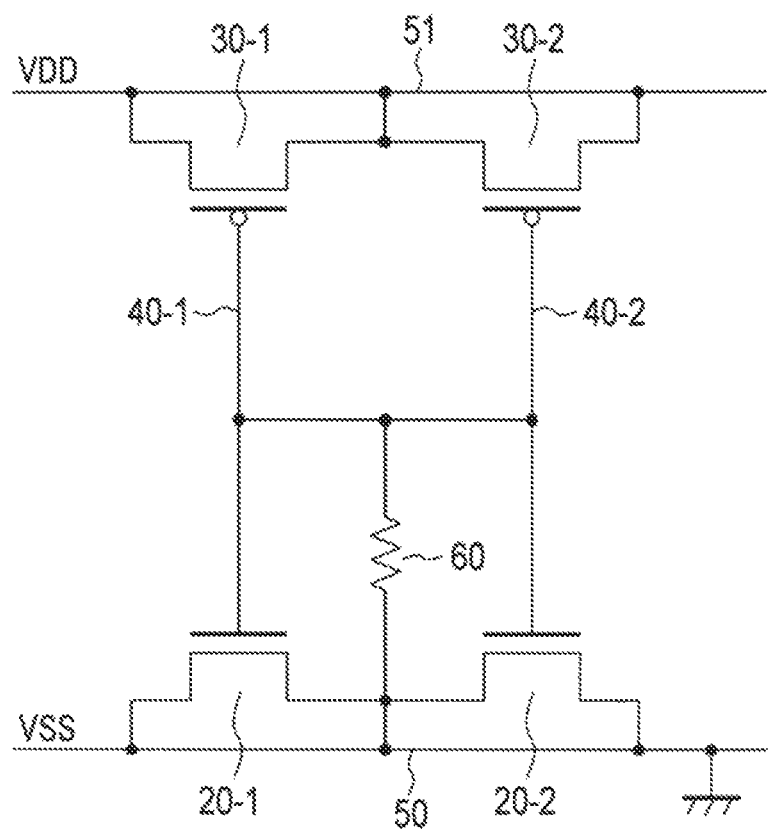
FIG. 13 is an equivalent circuit diagram illustrating a semiconductor integrated circuit according to a third embodiment.

First, the configuration of the semiconductor integrated circuit 1 according to this third embodiment will be described with reference to FIGS. 9 to 13. FIG. 9 illustrates a planar layout of the semiconductor integrated circuit 1. FIGS. 10 to 12 illustrate a cross-sectional structure of the semiconductor integrated circuit 1. FIG. 13 illustrates the configuration of an equivalent circuit of the semiconductor integrated circuit 1. The semiconductor integrated circuit 1 according to this third embodiment includes a pair of NMOS transistors 20 having sources connected in common (or shared) and a pair of PMOS transistors 30 having sources connected common (or shared), and is thus different in a connection relation of each wiring from that depicted for the first embodiment.

As illustrated in FIGS. 9 and 12, the semiconductor integrated circuit 1 according to this embodiment includes NMOS transistors 20-1 and 20-2 (a NMOS transistor pair), PMOS transistors 30-1 and 30-2 (a PMOS transistor pair), and the resistance element 60, all of which are formed on the semiconductor substrate 10.

In a P-type well region 11, $n^+$ impurity diffusion areas 13B-1, 13A, and 13B-2 are arranged in parallel in the X direction (see FIG. 10). In an N-type well region 12, $p^+$ impurity diffusion areas 14B-1, 14A, and 14B-2 are arranged in parallel in the X direction (see FIG. 11). Between the diffusion areas 13A and 13B-1 and between the diffusion areas 14A and 14B-1, a wiring layer 40-1 extending in the Y direction is arranged in the regions with the gate insulation films 41-1 and 42-1 interposed therebetween. Between the diffusion areas 13A and 13B-2 and between the diffusion areas 14A and 14B-2, a wiring layer 40-2 extending in the Y direction is arranged in the regions with the gate insulation films 41-2 and 42-2 interposed therebetween. The wiring layer 40-1 functions as a gate electrode of the transistors 20-1 and 30-1, and the wiring layer 40-2 functions as a gate electrode of the transistors 20-2 and 30-2. Accordingly, the NMOS transistor 20-1 and the PMOS transistor 30-1 using the wiring layer 40-1 as the common gate electrode (40-1) and the NMOS transistor 20-2 and the PMOS transistor 30-2 using the wiring layer 40-2 as the common gate electrode (40-2) are formed in the P-type well region 11 and the N-type well region 12, respectively. The NMOS transistors 20-1 and 20-2 and the PMOS transistors 30-1 and 30-2 share the $n^+$ impurity diffusion area 13A and the $p^+$ impurity diffusion area 14A, and have a configuration of line symmetry in which the Y direction serves as a symmetric axis.

Via contacts 23, 24-1, 24-2, 33, 34-1, and 34-2 are formed on diffusion areas 13A, 13B-1, 13B-2, 14A, 14B-1, and 14B-2, respectively. Wiring layers 21, 22-1, 22-2, 31, 32-1, and 32-2 are formed on the via contacts 23, 24-1, 24-2, 33, 34-1, and 34-2, respectively. A via contact 45 is further formed on the diffusion area 13A and a wiring layer 43 is formed on the via contact 45 (see FIG. 12).

The via contacts 23 and 45 are arranged in the Y direction and are separated from each other on the diffusion area 13A. The wiring layers 21 and 43 are also separated from each other, and both of the wiring layers 21 and 43 are electrically connected along a path passing through the via contact 23, the diffusion area 13A, and the via contact 45. At this time, the wiring layers 21 and 43 are not connected along any path not passing through the diffusion area 13A. The diffusion area 13A between the via contacts 23 and 45 functions as a diffusion resistor (resistance element 60).

The semiconductor integrated circuit 1 having the above-described configuration is illustrated as an equivalent circuit in FIG. 13. That is, the sources and the drains of the transistors 20-1 and 20-2 are connected to the low-voltage power line 50, and the sources and the drains of the transistors 30-1 and 30-2 are connected to the high-voltage power line 51. The common gate 40-1 of the transistors 20-1 and 30-1 is connected to the common gate 40-2 of the transistors 20-2 and 30-2. One end of the resistance element 60 is connected to the common gates 40-1 and 40-2 and the other end of the resistance element 60 is connected to the sources of the transistors 20-1 and 20-2.

For convenience of the description, the sources and the drains of the transistors 20-1, 20-2, 30-1, and 30-2 are represented as described above, but in other embodiments the positioning may be altered or otherwise varied and the embodiments are not limited to the depicted arrangement.

That is, the pair of NMOS transistors 20 and the pair of PMOS transistors 30 may also be configured to share the respective drains.

The method of connecting the common gates 40-1 and 40-2 to the low-voltage power lines are not limited thereto, but can be modified in various ways. For example, the common gates 40-1 and 40-2 may be connected to the diffusion areas 13B-1 and 13B-2. The combination of the diffusion areas serving as the resistance element 60 is not limited thereto. All of the diffusion areas 13A, 13B-1, and 13B-2 may serve as the resistance element 60 or at least one diffusion area 13 may be used as the resistance element 60.

[3-2] Advantages of Third Embodiment

According to this third embodiment, it is possible to obtain the same advantages as those of the first embodiment in a decoupling cell.

In a semiconductor integrated circuit such as a CMOS circuit, a capacitor is inserted between a high-voltage power line and a low-voltage power line in order to suppress effects of a fluctuation in a power supply during operation. As such a capacitor there is known a decoupling cell using a PMOS transistor and an NMOS transistor having a common gate in a floating state. In such a decoupling cell, there is the same concern as for a Tie-High cell and a Tie-Low cell (described in conjunction with the advantages of the first embodiment).

Therefore, according to the semiconductor integrated circuit 1 of this third embodiment, the common gate (the wiring layer 40) of the above-described decoupling cell is connected to the $n^+$ impurity diffusion area 13A to which the source wiring (the wiring layer 21) of the NMOS transistor 20 is connected. That is, the common gate 40 (40-1 and 40-2) is electrically connected to the low-voltage power line 50 through the diffusion area 13A and the source wiring of the transistor 20. Then, the diffusion area 13A substantially functions as the resistance element 60.

With the above-described configuration, the common gate 40 is connected to the low-voltage power line 50 through the resistance element 60, and thus a charge or discharge time necessary to fix the potential of the common gate 40 is shortened. The potential of the common gate 40 is connected to the low-voltage power line 50 through the resistance element 60, and is thus fixed to the potential of the low-voltage power line 50 without depending on the threshold voltage of the transistors included in the semiconductor integrated circuit 1.

In this way, according to the semiconductor integrated circuit 1 of this third embodiment, the same advantages as those of the first and second embodiments can be obtained in a decoupling cell in which fluctuation of a power supply is to be suppressed.

In the semiconductor integrated circuit 1 according to this third embodiment, the decoupling cell is configured using a pair of NMOS transistors 20 and a pair of PMOS transistors, but the disclosure is not limited thereto. In the semiconductor integrated circuit 1, for example, the number of transistors included in the decoupling cell may be varied. For example, one transistor may be included in each of the NMOS transistor 20 and the PMOS transistor 30, or three or more transistors may be included. In this way, it is possible to design the decoupling cell with desired capacitance for operation.

[4] Modification Examples

Next, Modification Examples 1 to 3 of the semiconductor integrated circuit 1 according to the third embodiment will be described. In the modification examples, the configuration of transistors is modified. Hereinafter, differences from the third embodiment will be described.

[4-1] Modification Example 1

Figure 14:
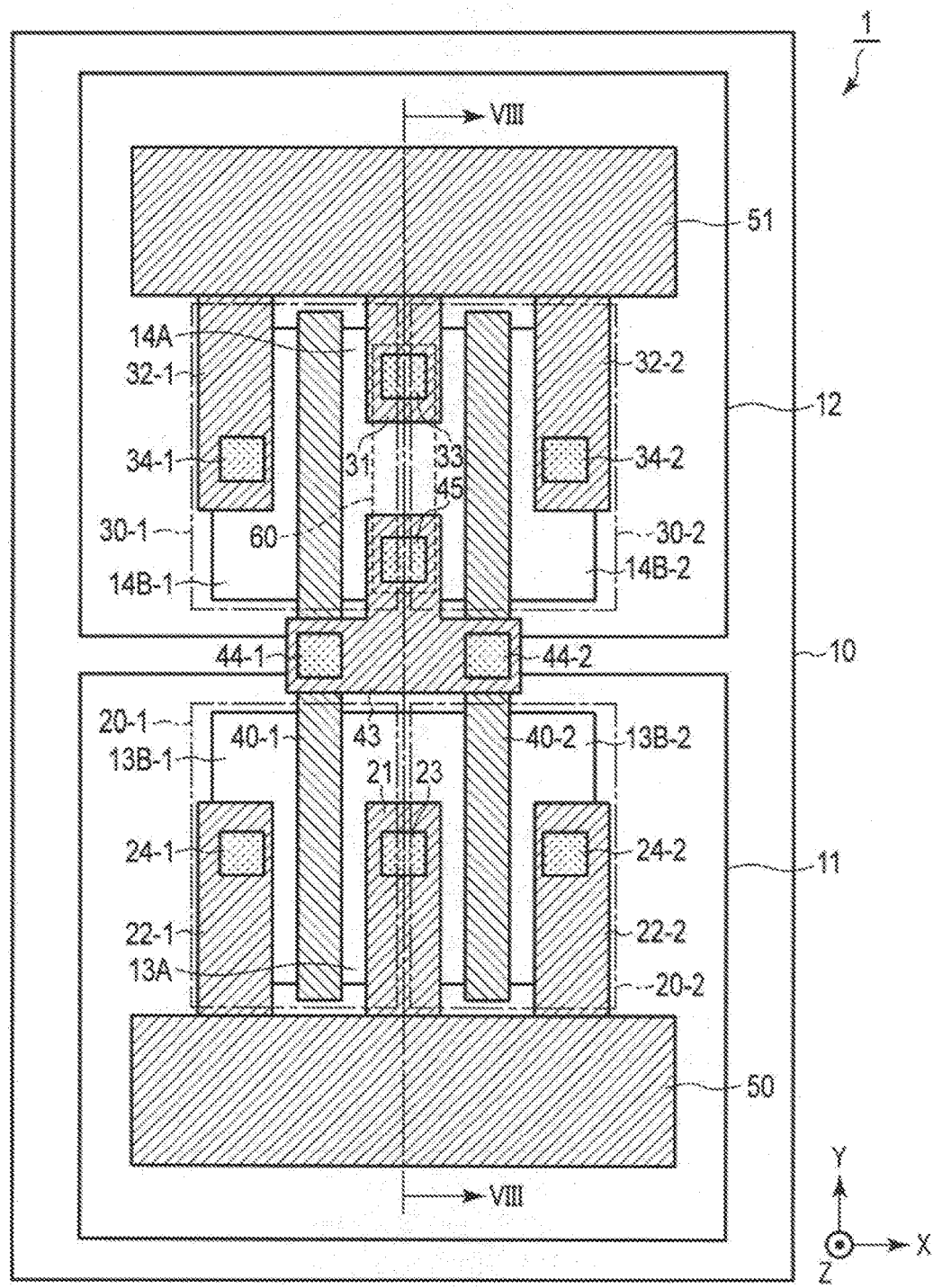
FIG. 14 is a diagram illustrating a layout of a semiconductor integrated circuit according to a Modification Example 1 of the third embodiment.
Figure 15:
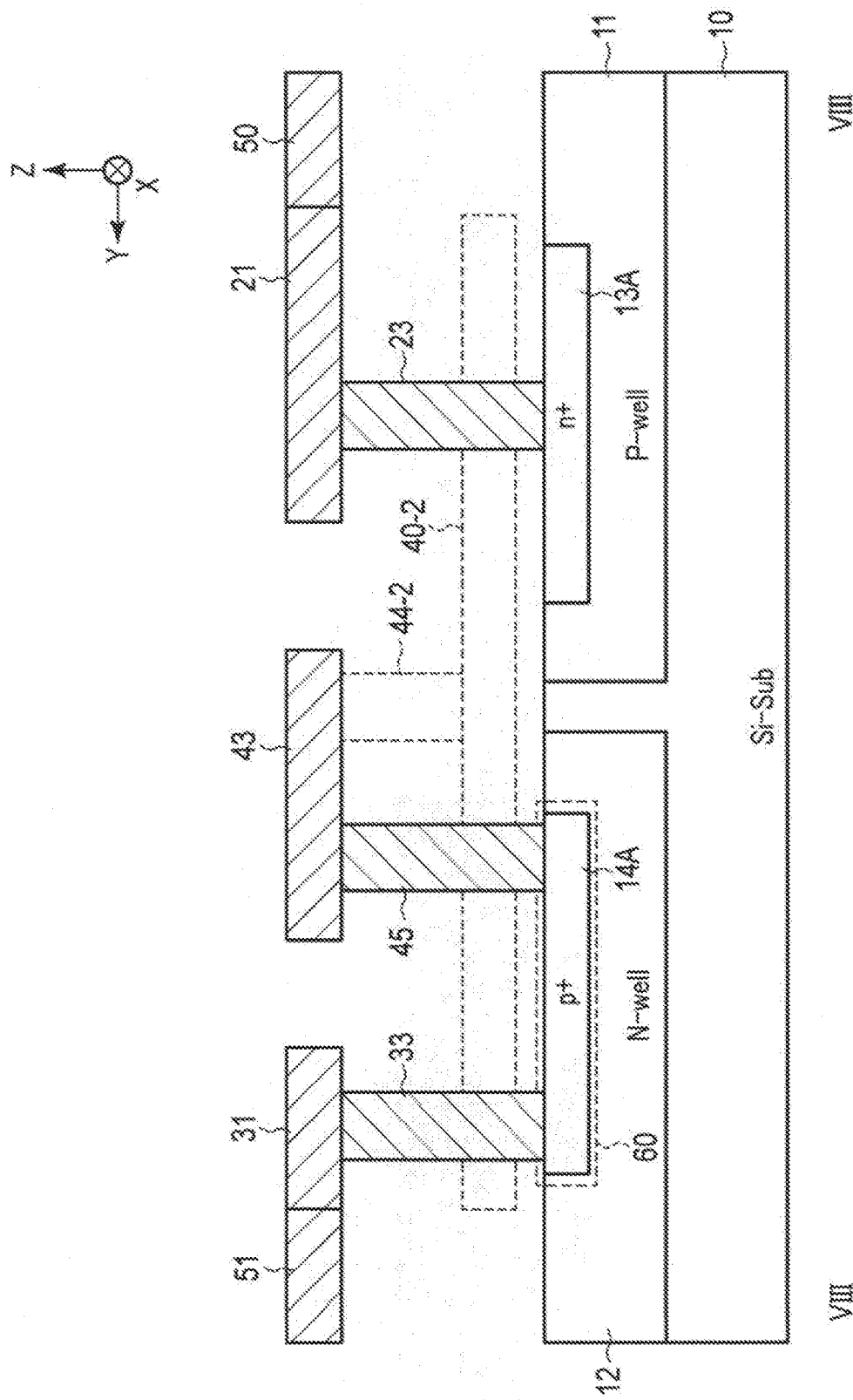
FIG. 15 is a cross-sectional view taken along the line VIII-VIII in FIG. 14.
Figure 16:
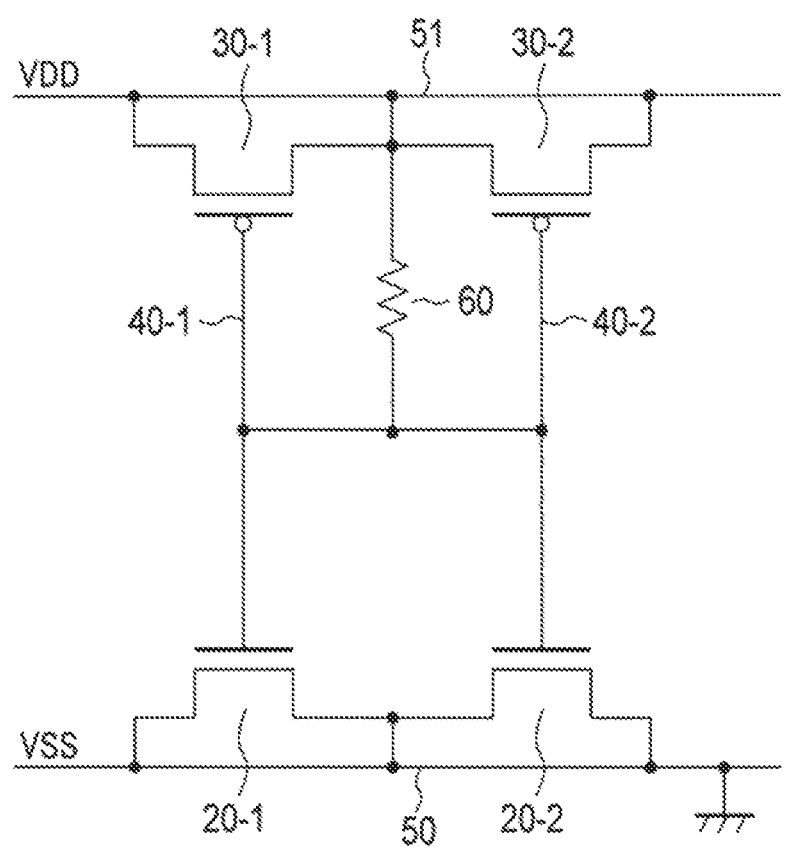
FIG. 16 is an equivalent circuit diagram illustrating the semiconductor integrated circuit according to the Modification Example 1 of the third embodiment.

First, a semiconductor integrated circuit 1 according to Modification Example 1 will be described with reference to FIGS. 14 to 16. FIG. 14 illustrates a planar layout of the semiconductor integrated circuit 1 according to the Modification Example 1. FIG. 15 illustrates a cross-sectional structure of the semiconductor integrated circuit 1 according to the Modification Example 1. FIG. 16 illustrates the configuration of an equivalent circuit of the semiconductor integrated circuit 1 according to the Modification Example 1.

The via contact 45 is formed on the diffusion area 13A (see FIGS. 9 and 12) as described in the third embodiment, but the via contact 45 is formed on the diffusion area 14A in the semiconductor integrated circuit 1 according to Modification Example 1, as illustrated in FIGS. 14 and 15. In Modification Example 1, that is, the diffusion area 14A between the via contacts 33 and 45 functions as a diffusion resistor (resistance element 60).

The semiconductor integrated circuit 1 having the above-described configuration according to the Modification Example 1 is illustrated as an equivalent circuit in FIG. 16. That is, the semiconductor integrated circuit 1 according to this Modification Example 1 has a configuration that the other end of the resistance element 60 is connected to the sources of the transistors 30-1 and 30-2, while the third embodiment described (refer to FIG. 13) has the configuration that the other end of the resistance element 60 is connected to the sources of the transistors 20-1 and 20-2.

With the above-described configuration, the semiconductor integrated circuit 1 according to the according to the Modification Example 1 can obtain similar advantages as those of the third embodiment.

[4-2] Modification Example 2

Figure 17:
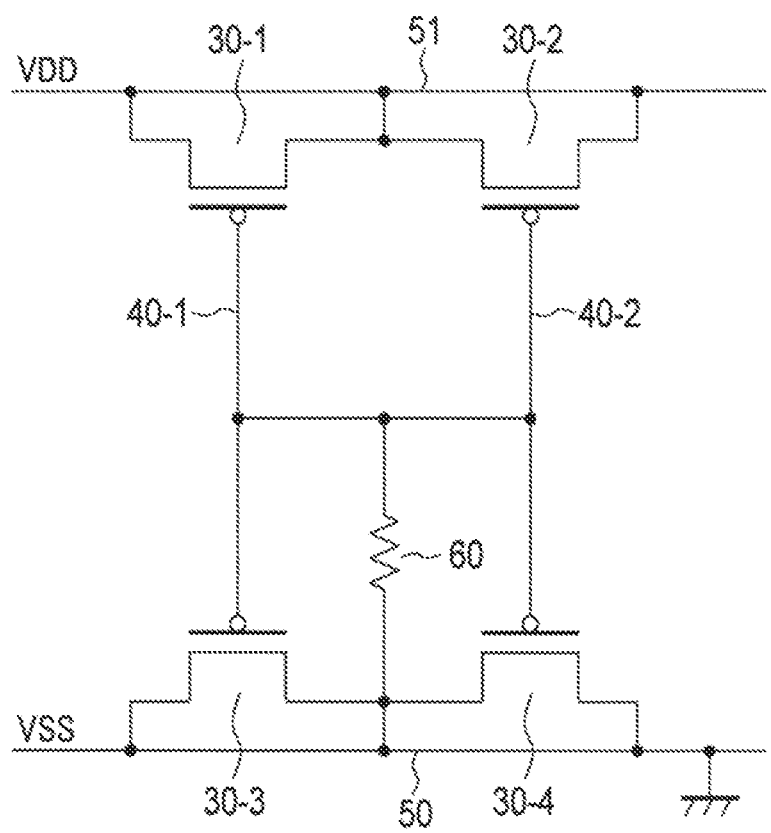
FIG. 17 is an equivalent circuit diagram illustrating a semiconductor integrated circuit according to a Modification Example 2 of the third embodiment.

Next, a semiconductor integrated circuit 1 according to Modification Example 2 will be described with reference to FIG. 17. FIG. 17 illustrates the configuration of an equivalent circuit of the semiconductor integrated circuit 1 according to Modification Example 2.

In the semiconductor integrated circuit 1 according to Modification Example 2, the NMOS transistors 20-1 and 20-2 in FIG. 13 described in the third embodiment are substituted with PMOS transistors 30-3 and 30-4. That is, the semiconductor integrated circuit 1 according to Modification Example 2 has the configuration illustrated in the equivalent circuit diagram in FIG. 17.

With the above-described configuration, the semiconductor integrated circuit 1 according to Modification Example 2 can obtain similar advantages as those of the third embodiment.

[4-3] Modification Example 3

Figure 18:
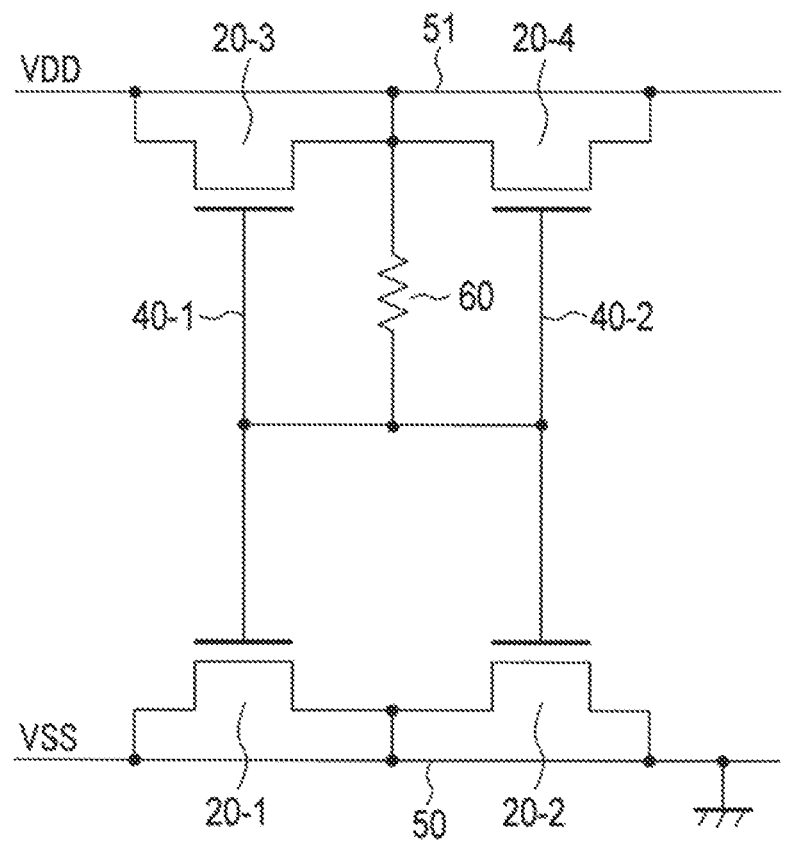
FIG. 18 is an equivalent circuit diagram illustrating a semiconductor integrated circuit according to a Modification Example 3 of the third embodiment.

Next, a semiconductor integrated circuit 1 according to Modification Example 3 will be described with reference to FIG. 18. FIG. 18 illustrates the configuration of an equivalent circuit of the semiconductor integrated circuit 1 according to Modification Example 3.

In the semiconductor integrated circuit 1 according to Modification Example 3, the PMOS transistors 30-1 and 30-2 in FIG. 16 described in Modification Example 1 of the third embodiment are substituted with NMOS transistors 20-3 and 20-4. That is, the semiconductor integrated circuit 1 according to Modification Example 3 has the configuration illustrated in the equivalent circuit diagram in FIG. 18.

With the above-described configuration, the semiconductor integrated circuit 1 according to Modification Example 3 can obtain similar advantages as those of the third embodiment.

[5] Others

The semiconductor integrated circuit 1 according to the above-described embodiments include a first transistor (e.g., element 30, FIG. 5), a second transistor (e.g., element 20, FIG. 5), and a resistance element (e.g., element 60, FIG. 5). One end of the first transistor is connected to the first power line (e.g., element 51, FIG. 1). Both ends (source/drain) of the second transistor are connected to the second power line (e.g., element 50, FIG. 1) which is different from the first power line. The first and second transistors share a gate electrode (e.g., element 40, FIG. 1). The resistance element is formed using a impurity diffusion area (e.g., element 13A, FIG. 4) corresponding to one of a source or a drain of the second transistor. One end of the resistance element is connected to the gates of the first and second transistors and the other end of the resistance element is connected to the one end of the second transistor.

Accordingly, it is possible to provide the semiconductor integrated circuit 1 capable of improving the ESD resistance.

The present disclosure is not limited to the above-described first to third embodiments and Modification Examples 1 to 3, but these examples may be modified in various forms and/or combined. For example, the number of transistors included in the decoupling cell is not limited. For example, one transistor connected to the high-voltage power line and one transistor connected to the low-voltage power line may be included at minimum to configure the decoupling cell. Even in such a configuration, it is possible to obtain the same advantages as those of the above-described embodiments by using the impurity diffusion area in one transistor as a diffusion resistor connected between the gate electrode and the high-voltage power line or the low-voltage power line.

The region used as the resistance element is not limited to the above-described embodiments or arrangements. In the first embodiment, for example, the via contacts 23 and 45 may be arranged in a gate width direction or may be arranged obliquely. That is, the diffusion area 13A may be used as a resistor. The distance between the via contacts 23 and 45 can be set adjust a resistance value to be sufficient to connect the common gate 40 to the low-voltage power line. The sizes of the via contacts may also be different.

The number of via contacts connecting the wiring layer 40 to the wiring layer 43 and the number of via contacts connecting the wirings to the impurity diffusion areas are not limited to the above-described embodiments. For example, a plurality of via contacts 33 may be formed on the impurity diffusion area 14A, and the impurity diffusion area 14A and the wiring layer 31 may be electrically connected to each other through the plurality of via contacts 33.

In the above-described embodiments, the wiring layer 40 may be divided to be formed between the transistors sharing the gate. In this case, the via contacts 44 are formed on the divided wiring layers 40. The divided wiring layers 40 are electrically connected through the wiring layer 43.

The "connection" in the above-described description indicates electrical connection and includes not only a case of direct connection but also a case of connection through other elements.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
a first transistor comprising a first impurity region of a first conductivity type in a first well region of a conductivity type opposite the first conductivity type, a second impurity region of the first conductivity type in the first well region, and a first gate electrode on the first well region between the first and second impurity regions, the first impurity region being electrically connected to a first power line;
a second transistor comprising a third impurity region of a second conductivity type in a second well region of a conductivity type opposite the second conductivity type, a fourth impurity region of the second conductivity type in the second well region, a second gate electrode on the second well region between the third and fourth impurity regions, the second gate electrode being electrically connected to the first gate electrode through a wiring layer, and the third and fourth impurity regions being electrically connected to a second power line; and
a resistance element comprising a first end electrically connected to the first and second gate electrodes, a second end electrically connected to the second power line, and a resistive electrical path between the first and second ends including a portion of the third impurity region, the portion of the third impurity region extending along the wiring layer.

2. The semiconductor integrated circuit according to claim 1, wherein the first transistor is a PMOS transistor, and the second transistor is an NMOS transistor.

3. The semiconductor integrated circuit according to claim 1, wherein the first transistor is an NMOS transistor, and the second transistor is a PMOS transistor.

4. The semiconductor integrated circuit according to claim 1, wherein the first conductivity type is p type, and the second conductivity is n type.

5. The semiconductor integrated circuit according to claim 1, wherein the first gate electrode, the second gate electrode, and the wiring layer are a single, continuous wire disposed on a gate insulating film and extending from the first well region to the second well region.

6. The semiconductor integrated circuit according to claim 1, wherein
the first power line and the second power line are disposed in a wiring level above a gate level in which the first and second gate electrodes are disposed,
an electrical connection between the first impurity region and first power line is through a first via,
an electrical connection between the third impurity region and the second power line is through a second via,
an electrical connection between the first end of the resistance element and the first and second gate electrodes is through a third via disposed on the third impurity region, a wiring connection portion connected to the third via and disposed in the wiring level, and a fourth via disposed on the wiring layer.

7. The semiconductor integrated circuit according to claim 1, further comprising:
a third transistor comprising a fifth impurity region of the first conductivity type in the first well region, the second impurity region, and a third gate electrode on the first well region between the second impurity region and the fifth impurity region, the second and fifth impurity regions being electrically connected to the first power line, the third gate electrode being electrically connected to the first gate electrode; and
a fourth transistor comprising a sixth impurity region of the second conductivity type in the second well region, the third impurity region, and a fourth gate electrode on the second well region between the third and sixth impurity regions, the fourth gate electrode being electrically connected to the second gate electrode.

8. A semiconductor integrated circuit, comprising:
a first well region and a second well region on a surface of a substrate;
a first impurity region and a second impurity region on a surface of the first well region, the first and second impurity regions having a first conductivity type that is opposite a conductivity type of the first well region;
a third impurity region and a fourth impurity region on a surface of the second well region, the second and third impurity regions having a second conductivity type that is opposite a conductivity type of the second well region;
a first wiring layer on the first well region between the first and second impurity regions and on the second well region between the third and fourth impurity regions;
a first via and a second via contacting a surface of the third impurity region, the first and second vias being spaced from each other on the surface of the third impurity region and connected to each other through a portion of the third impurity region, the portion of the third impurity region extending along the first wiring layer;
a third via contacting the first wiring layer;
a second wiring layer connecting the first via to the third via; and
a third wiring layer contacting the second via and electrically connected to the second wiring layer through the portion of the third impurity region, wherein
the first and second impurity regions are a source or a drain region of a first transistor having a first gate electrode formed by a first portion of the first wiring layer,
the third and fourth impurity regions are a source or drain region of a second transistor having a second gate electrode formed by a second portion of the first wiring layer, and
the first and second gate electrodes are connected in common to each other.

9. The semiconductor integrated circuit according to claim 8, wherein
the first impurity region is connected to a first power line,
the third and fourth impurity regions are connected to a second power line, and
the first and second gate electrodes are connected to the second power line only through an electrical path including the portion of the third impurity region.

10. The semiconductor integrated circuit according to claim 9, wherein the first transistor is a PMOS transistor, and the second transistor is a NMOS transistor.

11. The semiconductor integrated circuit according to claim 9, wherein the first, second, third, and fourth impurity regions are formed by an impurity diffusion method.

12. The semiconductor integrated circuit according to claim 9, wherein
the first wiring layer is polysilicon, and
the second and third wiring layers are metal.

13. The semiconductor integrated circuit according to claim 9, wherein the second and third wiring layers are at a same distance from the surface of the substrate in a direction orthogonal to the surface of the substrate.

14. The semiconductor integrated circuit according to claim 9, further comprising:
a fifth impurity region of the first conductivity type on the surface of the first well region;
a fourth wiring layer on the surface of the first well region between the second impurity region and the fifth impurity region, the second and fifth impurity regions being electrically connected to a first power line, the fourth wiring layer being electrically connected to the first wiring layer;
a sixth impurity region of the second conductivity type on the surface of the second well region, the fourth wiring layer being on the surface of second well region between the third and sixth impurity regions, the third and sixth impurity regions being electrically connected to a second power line.

15. The semiconductor integrated circuit according to claim 14, wherein the first conductivity type is p type, and the second conductivity type is n type.

16. A semiconductor integrated circuit, comprising:
a first well region of a first conductivity type;
a second well region of a second conductivity type and adjacent to the first well region in a first direction;
a first doped region in the first well region having a conductivity type that is opposite the first conductivity type;
a second doped region in the first well region spaced from the first doped region in a second direction perpendicular to the first direction and having the conductivity type that is opposite the first conductivity type;
a third doped region in the second well region having a conductivity type that is opposite the second conductivity type;
a fourth doped region in the second well region spaced from the third doped region in the second direction and having the conductivity that is opposite the second conductivity type;
a common gate electrode layer extending in the first direction between the first and second well regions, disposed on a surface of the first well region between the first and second doped regions in the second direction, and disposed on a surface of the second well region between the third and fourth doped regions in the second direction, a gate insulating film being between the common gate electrode layer and the surfaces of the first and second well regions;
a first power line electrically connected to the first doped region;
a second power line electrically connected to the third and fourth doped regions; and
a resistive element electrically connected between the second power line and the common gate electrode layer, the resistive element comprising:
a first via contacting the third doped region and connected to the second power line,
a second via contacting the third doped region, spaced from the first via, and connected to the first via through a portion of the third doped region, the portion of the third doped region extending in the first direction,
a third via contacting the common gate electrode layer, and
a connecting wiring portion on the second via and the third via.

17. The semiconductor integrated circuit according to claim 16, wherein the connection wiring portion, the first power line, and the second power line are in a same wiring level at a same distance from the surfaces of the first and second well regions.

18. The semiconductor integrated circuit according to claim 16, wherein the first and second conductivity types are opposite conductivity types.

19. The semiconductor integrated circuit according to claim 1, wherein the portion of the third impurity region extends along an edge of the second well region.

20. The semiconductor integrated circuit according to claim 8, wherein the portion of the third impurity region extends along an edge of the second well region.

* * * * *